United States Patent
Horiuchi et al.

(10) Patent No.: US 6,731,010 B2
(45) Date of Patent: May 4, 2004

(54) RESIN SEALED STACKED SEMICONDUCTOR PACKAGES WITH FLAT SURFACES

(75) Inventors: Michio Horiuchi, Nagano (JP); Takashi Kurihara, Nagano (JP)

(73) Assignee: Shinko Electric Industries Co., LTD., Nagano (JP)

( * ) Notice: Subject to any disclaimer, the term of this patent is extended or adjusted under 35 U.S.C. 154(b) by 0 days.

(21) Appl. No.: 09/922,872

(22) Filed: Aug. 6, 2001

(65) Prior Publication Data

US 2002/0031867 A1 Mar. 14, 2002

(30) Foreign Application Priority Data

Sep. 14, 2000 (JP) .......................... 2000-280555

(51) Int. Cl.$^7$ .......................... H01L 23/02; H01L 23/48
(52) U.S. Cl. .......................... 257/777; 257/686
(58) Field of Search .......................... 257/678, 684, 257/787, 778, 666, 676, 723, 730, 777, 686

(56) References Cited

U.S. PATENT DOCUMENTS

| | | | |
|---|---|---|---|
| 4,214,364 A | | 7/1980 | St. Louis et al. |
| 5,384,689 A | * | 1/1995 | Shen .......................... 361/761 |
| 5,693,573 A | | 12/1997 | Choi |
| 5,696,666 A | | 12/1997 | Miles et al. |
| 5,710,071 A | * | 1/1998 | Beddingfield et al. ...... 438/108 |
| 5,723,900 A | | 3/1998 | Kojima et al. |
| 5,776,798 A | | 7/1998 | Quan et al. |
| 5,844,168 A | | 12/1998 | Schueller et al. |
| 5,854,741 A | | 12/1998 | Shim et al. |
| 5,898,212 A | * | 4/1999 | Kim .......................... 257/666 |
| 5,925,934 A | | 7/1999 | Lim |
| 5,977,640 A | | 11/1999 | Bertin et al. |
| 6,023,098 A | | 2/2000 | Higashiguchi et al. |
| 6,046,504 A | * | 4/2000 | Kimura .......................... 257/775 |
| 6,060,373 A | | 5/2000 | Saitoh |
| 6,077,724 A | | 6/2000 | Chen |
| 6,100,804 A | * | 8/2000 | Brady et al. .............. 340/572.7 |
| 6,190,943 B1 | * | 2/2001 | Lee et al. .................... 438/107 |
| 6,265,768 B1 | * | 7/2001 | Su et al. ...................... 257/684 |
| 6,291,264 B1 | * | 9/2001 | Tang et al. .................. 438/106 |
| 6,348,729 B1 | * | 2/2002 | Li et al. ...................... 257/691 |
| 6,459,152 B1 | * | 10/2002 | Tomita et al. .............. 257/738 |

FOREIGN PATENT DOCUMENTS

| | | |
|---|---|---|
| EP | 0 771 029 A2 | 5/1997 |
| EP | 0 915 505 A1 | 5/1999 |
| EP | 0 969 504 A1 | 1/2000 |
| JP | A-6-333960 | 12/1994 |
| JP | 2000012745 | 1/2000 |
| WO | WO 98/36450 | 8/1998 |
| WO | WO98/36450 | 8/1998 |

* cited by examiner

Primary Examiner—Kamand Cuneo
Assistant Examiner—Scott B. Geyer
(74) Attorney, Agent, or Firm—Paul & Paul

(57) ABSTRACT

A semiconductor device which reduces and simultaneously achieves a uniform mounting height, does not require complicated steps for mounting individual chips, improves the manufacturing yield, achieves a uniform height of the semiconductor device without being affected by the variation in thickness of the chips, and enables execution of electrical tests all together and a process for production of the same, wherein a semiconductor chip is housed, with its active surface facing upward, in a through hole of a printed circuit board provided with an interconnection pattern on its top surface, electrode terminals of the active surface are connected to the interconnection pattern by bonding wires, a sealing resin layer seals the bonding wires and semiconductor chip together and fixes the semiconductor chip in the through hole, and the bottom surface of the printed circuit board, the downward facing back surface of the semiconductor chip, and the bottom surface of the sealing resin layer are finished to the same flat surface by grinding and polishing.

7 Claims, 8 Drawing Sheets

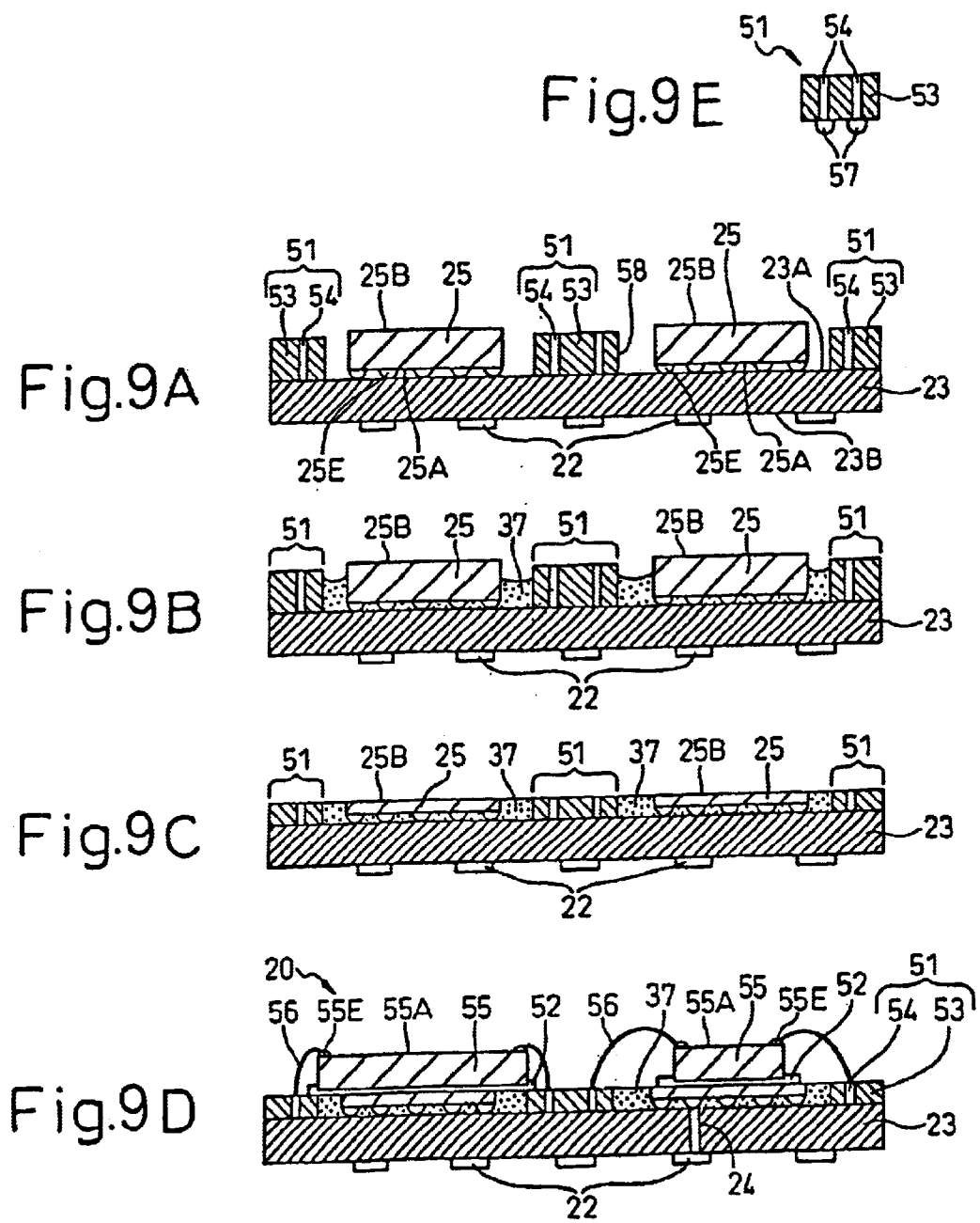

RESIN SEALED STACKED SEMICONDUCTOR PACKAGES WITH FLAT SURFACES

RELATED APPLICATIONS

The present disclosure relates to subject matter contained in Japanese Patent Application No. 2000-280555, filed on Sep. 14, 2000, the disclosure of which is expressly incorporated herein by reference in its entirety.

BACKGROUND OF THE INVENTION

1. Field of the Invention

The present invention relates to a semiconductor device and a process for production of the same, more particularly relates to a thin package semiconductor device and a process of production of the same.

2. Description of the Related Art

The most flexible type of thin package semiconductor device mounting a semiconductor chip (LSI or other semiconductor chip) for the increase of pins, reduction of the pitch between connection terminals, and reduction of thickness and size of the device as a whole is the tape carrier package (TCP).

A TCP is produced by mounting a semiconductor chip on an insulating tape substrate (usually a resin film) by tape automated bonding (TAB). Typically, first, a copper foil is attached to a resin film provided with a predetermined pattern of openings, then the copper foil is etched to pattern it to form predetermined copper leads. Next, a semiconductor chip is positioned and held within an opening of the resin film, a plurality of connection terminals of the chip (in general gold bumps) and a corresponding plurality of copper leads on the resin film are bonded together, then the semiconductor chip and part of the copper leads are sealed by a resin to complete a single semiconductor package unit. This operation is repeated for every opening while intermittently feeding the resin film, whereby a large number of semiconductor package units are formed on a single film. Finally, the large number of semiconductor package units formed along the longitudinal direction of the film are cut and separated from each other so as to obtain individual semiconductor packages.

FIG. 1 is a perspective view of a semiconductor device of the related art obtained by connecting a semiconductor chip and TCP leads. It shows the state before the individual TCPs are cut from the tape. The TCP 10 uses a resin film (for example, a polyimide resin film) 1 as a substrate and has leads 2 formed by etching of a copper foil on top. Further, sprocket holes 3 are formed at the two side edges of the resin film 1 for feeding the film. An opening 5 for accommodating a semiconductor chip 4 (in general called a "device hole") and window holes 9 are also formed in the center of the resin film 1 as illustrated.

The state of connection of the semiconductor chip and the leads of the package is shown in the sectional view of FIG. 2, which shows the center portion of the semiconductor device of FIG. 1 enlarged. A semiconductor chip 4 is positioned and placed in the device hole 5 of the resin film 1, then the front ends of the leads 2 are bonded on the bumps on the electrodes (normally projections formed by gold plating). The leads are normally bonded all together using a special bonding tool. Note that to assist the bonding of the bumps 6 with the front ends of the leads 2 comprised of copper, the bumps are gold plated in advance before the bonding step. Finally, while not shown in FIG. 1, the semiconductor chip 4 and the leads 6 are protected from the humidity, contamination, etc. of the ambient environment by sealing the two to cover them by a resin 7. As the sealing resin 7, use is made for example of an epoxy resin.

The above semiconductor device of the related art however suffered from the following problems (a) to (e):

(a) There are limits to the reduction of the mounting height of the semiconductor chip on a resin film, so there are limits to the reduction of thickness of the semiconductor device. That is, the semiconductor device is fixed by thin copper leads projecting out in a bridge like manner into the opening of the resin film, so securing sufficient mounting strength requires that the copper leads, the resin film serving as the support member, and the device as a whole be at least a certain thickness. If reinforcing the strength by the resin sealed portion, a broad area has to be sealed thickly. It is difficult however to secure complete sealing across a broad area. Further, thick sealing runs counter to the desire to reduce thickness.

(b) Semiconductor chips become brittle and easily warpable when made thin enough for reducing the thickness of the semiconductor device. Each requires a special carrier. Handling is extremely complicated and a large number of steps are required. Further, improvement of the manufacturing yield also becomes difficult.

(c) The individual semiconductor chips have to be individually positioned and bonded in the openings of the resin film, so production of a large number of semiconductor packages requires a long, complicated production process.

(d) In the case of a stacked chip type semiconductor device obtained by stacking semiconductor chips in a plurality of layers, each individual semiconductor chip has to be positioned and bonded in the opening of the resin film, so the production process becomes even longer and more complicated.

(e) Not only is there a manufacturing variation in the thickness of the chips, but there is also variation in the individual mounting heights. As a result, a variation in height arises in the semiconductor devices. It is consequently difficult to conduct electrical tests in a block before cutting and separating the film into the semiconductor package units.

SUMMARY OF THE INVENTION

An object of the present invention is to solve the above problems in the related art and provide a semiconductor device, in particular a thin semiconductor package, which reduces and simultaneously achieves a uniform mounting height, does not require complicated steps for mounting individual chips, improves the manufacturing yield, achieves a uniform height of the semiconductor device without being affected by the variation in thickness of the chips, and enables execution of electrical tests in a block and a process for production of the same.

To achieve the above object, according to a first aspect of the present invention, there is provided a semiconductor device, wherein a semiconductor chip is housed with its active surface facing upward in a through hole of a printed circuit board provided with an interconnection pattern on its top surface, electrode terminals of the active surface are connected with the interconnection pattern by bonding wires, a sealing resin layer seals the bonding wires and semiconductor chip integrally and fixes the semiconductor chip in the through hole, and a bottom surface of the printed circuit board, a downward facing back surface of the semiconductor chip, and a bottom surface of the sealing resin layer are finished to the same flat surface by grinding.

According to a second aspect of the present invention, there is provided a process of production of a semiconductor device comprising bonding a temporary support to a bottom surface of a printed circuit board provided with a through hole and an interconnection pattern on its top surface to define a bottom of the through hole, bonding a semiconductor chip with its back surface facing downward to the bottom, connecting electrode terminals of the upward facing active surface of the semiconductor chip and the interconnection pattern by bonding wires, using a sealing resin layer to integrally seal the bonding wires and the semiconductor chip and fix the semiconductor chip in the through hole, removing the temporary support, and finishing a bottom surface of the printed circuit board, a downward facing back surface of the semiconductor chip, and a bottom surface of the sealing resin layer to the same flat surface by grinding.

Preferably, the printed circuit board has a large number of areas for forming semiconductor devices, all of the steps are performed for each of the areas so as to form a large number of semiconductor devices on the printed circuit board in a block, then the printed circuit board is cut between the individual areas to separate the individual semiconductor devices.

According to a third aspect of the present invention, there is provided a semiconductor device, wherein a semiconductor chip is housed with its active surface facing upward in a through hole of a lead frame having leads, electrode terminals of the active surface are connected with the top surface of the leads by bonding wires, a sealing resin layer seals the bonding wires and semiconductor chip integrally and fixes the semiconductor chip in the through hole, and a bottom surface of the lead frame, a downward facing back surface of the semiconductor chip, and a bottom surface of the sealing resin layer are finished to the same flat surface by grinding.

According to a fourth aspect of the present invention, there is provided a process of production of a semiconductor device comprising forming a lead frame having a planar part having leads and a vessel for housing a semiconductor chip, the bottom of the vessel projecting downward from a bottom surface of the planar part, and a top end of the vessel being open and connecting with the planar part; bonding a semiconductor chip on the bottom surface in the vessel so that its active surface faces upward and becomes higher than the bottom surface of the planar part; connecting electrode terminals of the active surface and the upper surfaces of the leads of the lead frame by bonding wires; using a sealing resin layer to integrally seal the bonding wires and the semiconductor chip and fix the semiconductor chip in the vessel; and grinding the vessel of the lead frame, the semiconductor chip, and the sealing resin layer from the bottom to substantially remove the vessel of the lead frame and finish a bottom surface of the planar part of the lead frame, a downward facing back surface of the semiconductor chip, and a bottom surface of the sealing resin layer to the same flat surface.

Preferably, the lead frame has a large number of areas for forming semiconductor devices, all of the steps are performed for each of the areas so as to form a large number of semiconductor devices on the lead frame in a block, then the lead frame is cut between the individual areas to separate the individual semiconductor devices.

According to a fifth aspect of the present invention, there is provided a semiconductor device, wherein an active surface of a semiconductor chip is bonded to a printed circuit board provided with a through hole and an interconnection pattern on its top surface, the active surface defining a bottom of the through hole; electrode terminals of the active surface defining the bottom are connected with the interconnection pattern by bonding wires passing through the through hole; a sealing resin layer fills the through hole and seals the bonding wires; and a downward facing back surface of the semiconductor chip is finished by grinding.

According to a sixth aspect of the present invention, there is provided a process of production of a semiconductor device comprising forming a printed circuit board provided with a through hole and an interconnection pattern on its top surface, bonding an active surface of a semiconductor chip to a bottom surface of the printed circuit board to define a bottom of the through hole, connecting electrode terminals of the active surface defining the bottom and the interconnection pattern by bonding wires passing through the through hole, using a sealing resin layer to fill the through hole and seal the bonding wires, and finishing a downward facing back surface of the semiconductor chip to a flat surface by grinding.

Preferably, the printed circuit board has a large number of areas for forming semiconductor devices, all of the steps are performed for each of the areas so as to form a large number of semiconductor devices on the printed circuit board in a block, then the printed circuit board is cut between the individual areas to separate the individual semiconductor devices.

According to a seventh aspect of the present invention, there is provided a semiconductor device wherein a semiconductor chip with its active surface facing downward is connected by flip chip bonding to a top surface of a printed circuit board provided with a top surface having pads connected to an interconnection pattern of its bottom surface, an underfill material covers the side faces of the semiconductor chip and fills a clearance between the active surface of the semiconductor chip and the top surface of the printed circuit board, and an upward facing back surface of the semiconductor chip is finished to a flat surface by grinding.

According to an eighth aspect of the present invention, there is provided a process of production of a semiconductor device comprising forming a printed circuit board provided with a top surface having pads connected to an interconnection pattern of its bottom surface, connecting to the top surface of the printed circuit board a semiconductor chip with its active surface facing downward by flip chip bonding, using an underfill material to cover the side faces of the semiconductor chip and fill a clearance between the active surface of the semiconductor chip and the top surface of the printed circuit board, and finishing an upward facing back surface of the semiconductor chip to a flat surface by grinding.

Preferably, the printed circuit board has a large number of areas for forming semiconductor devices, all of the steps are performed for each of the areas so as to form a large number of semiconductor devices on the printed circuit board in a block, then the printed circuit board is cut between the individual areas to separate the individual semiconductor devices.

According to a ninth aspect of the present invention, there is provided a stacked chip type semiconductor device comprised of a semiconductor chip finished by grinding of the semiconductor device as set forth in any one of the first, third, fifth, and seventh aspects of the invention another semiconductor chip bonded at its back surface to the former's back surface.

According to a 10th aspect of the present invention, there is provided a process of production of a stacked chip type semiconductor device comprising performing all of the steps set forth in any one of the second, fourth, sixth, and eighth aspects of the invention, then bonding a back surface of another semiconductor chip to the back surface of the semiconductor chip finished by grinding.

According to an 11th aspect of the present invention, there is provided a process of production of a stacked chip type semiconductor device comprising performing all of the steps set forth in any one of the second, fourth, sixth, and eighth aspects of the invention, at each of a large number of areas for forming semiconductor devices of a printed circuit board or lead frame so as to form a large number of semiconductor devices on the printed circuit board or lead frame in a block, bonding back surfaces of other semiconductor chips to the back surfaces of the semiconductor chips finished by grinding of the semiconductor devices, then cutting the printed circuit board or lead frame between the individual areas to separate the individual semiconductor devices.

BRIEF DESCRIPTION OF THE DRAWINGS

The above object and features of the present invention will be more apparent from the following description of the preferred embodiments given with reference to the accompanying drawings, wherein:

FIGS. 9A to 9E are sectional views of the structure by process steps of production of a semiconductor device according to the present invention shown in FIG. 4.

DETAILED DESCRIPTION OF THE INVENTION

Preferred embodiments of the present invention will be explained in further detail below with reference to the attached drawings.

The semiconductor device of the present invention is obtained by electrically connecting the active surface side of a semiconductor chip and an interconnection pattern and mechanically fixing (sealing) the semiconductor chip with a printed circuit board or lead frame, then grinding and polishing the back surface side of the semiconductor chip to reduce the thickness of the chip. By this, the above problems of the related art are solved, the mounting height is reduced and simultaneously made even, there is no need for the complicated process of mounting individual chips, the manufacturing yield is improved, the heights of the semiconductor devices can be made uniform without being affected by variations in thickness of the chips, and electrical testing becomes possible in a block.

In particular, employing the structure of the present invention is extremely advantageous in practice in the point of enabling inexpensive production of a thin-type Semiconductor device using existing semiconductor assembly facilities and processes. Further, using the thin-type semiconductor device of the present invention enables a reduction of size and thickness of the electrical equipment including the semiconductor device.

First Embodiment

FIGS. 3A and 5A–5C explain an example of a preferred embodiment of a semiconductor device and method of production of the same according to first and second aspects of the present invention.

Figure 1:
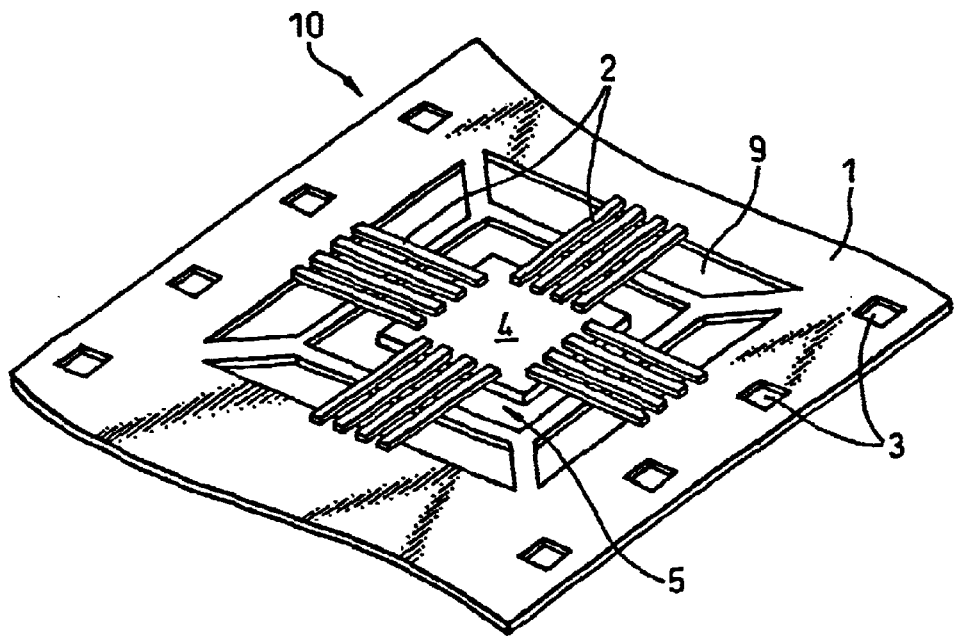
FIG. 1 is a perspective view of a semiconductor device of the related art after connecting a semiconductor chip and leads of a TCP and shows the state before cutting the individual TCPs from a tape.
Figure 2:
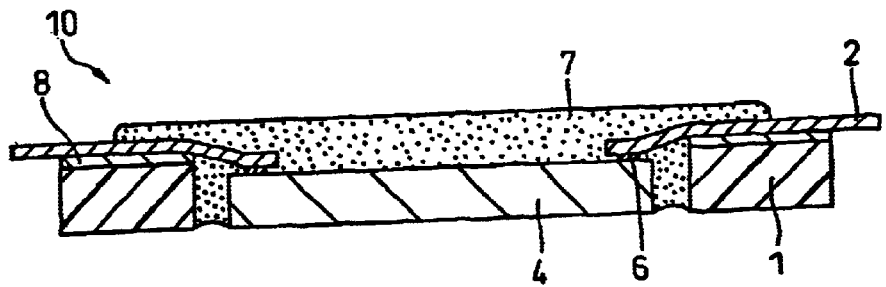
FIG. 2 is a sectional view of the connection of a semiconductor chip and leads of a package in the related art and shows the center part of the semiconductor device of FIG. 1 enlarged.
Figure 3A:
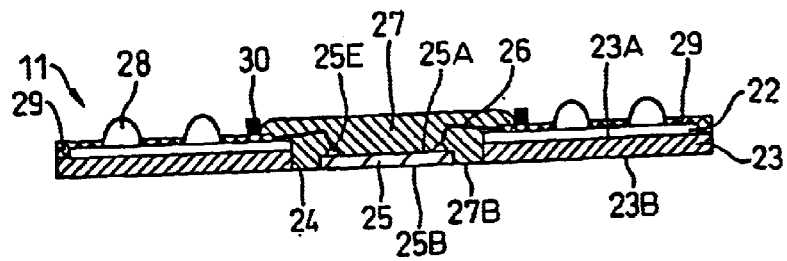
FIGS. 3A to 3D are sectional views of semiconductor devices according to the first, third, fifth, and seventh aspects of the present invention.

The semiconductor device 11 according to the first aspect of the present invention shown in FIG. 3A is comprised of a printed circuit board 23 provided with an interconnection pattern 22 on its top surface 23A and a semiconductor chip 25 housed inside a through hole 24 with its active surface 25A facing upward. The electrode terminals 25E of the active surface 25A are connected with the interconnection pattern 22 by the bonding wires 26. A sealing resin layer 27 integrally seals the bonding wires 26 and the semiconductor chip 25 and fixes the semiconductor chip 25 inside the through hole 24. The bottom surface 23B of the printed circuit board 23, the downward facing back surface 25B of the semiconductor chip 25, and the bottom surface 27B of the sealing resin layer 27 are finished to the same flat surface by grinding and polishing.

Solder balls 28 are formed as external connection terminals at predetermined positions of the interconnection pattern 22. The other portions of the interconnection pattern 22 are covered by a solder resist layer 29. The outer edges of the sealing resin layer 27 are defined by a dam bar 30 formed by a resin.

Figure 5A:
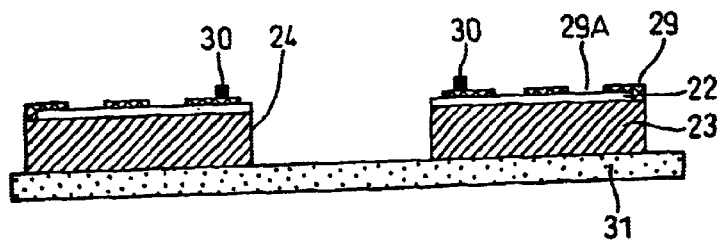
FIGS. 5A to 5C are sectional views of the structure by process steps of production of a semiconductor device according to the first aspect of the invention shown in FIG. 3A.
Figure 5B:
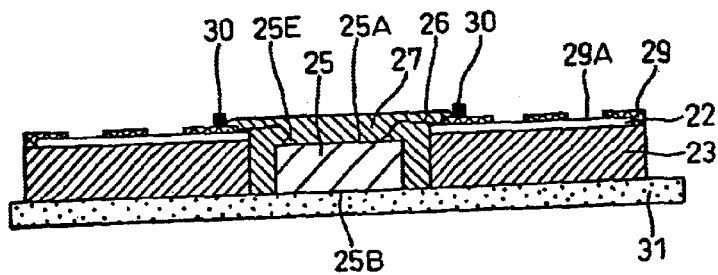
Figure 5C:
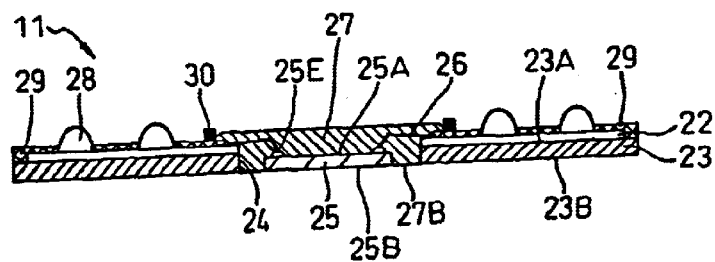

The semiconductor device 11 is produced by the steps shown in FIGS. 5A–5C.

FIG. 5A shows the state of bonding the printed circuit board to a temporary support 31. The printed circuit board 23 can take various forms. As one example, it is a glass epoxy substrate clad on its top surface with copper foil which is etched to form the interconnection pattern 22. The printed circuit board 23 used in this embodiment is a matrix printed circuit board including a large number of areas for forming semiconductor devices.

Each area of the printed circuit board 23 is formed with a through hole 24 for housing a semiconductor chip. The top surface of the interconnection pattern 22 is covered with a solder resist layer 29 other than at the openings 29A for forming the solder balls in a later step (FIG. 5C. Further, to define the outer edges of the sealing resin layer in a later step (FIG. 5B), a frame-shaped dam bar 30 surrounding the upper edges of the through hole 4 is provided. The dam bar 30 is formed by coating a resin by a dispenser in a frame shape and then curing it.

The temporary support 32 is bonded to the entire bottom surface of the printed circuit board 23 prepared in this way by sticking or adhesion. The temporary support 31 closes off the bottom end of the through hole 24 to define a bottom. The temporary support 31 is adhered to the printed circuit board 23 by a thermally peelable adhesive so as to enable easy peeling before grinding and polishing in the later step (FIG. 5C) or is made of a material which can be easily removed by grinding and polishing. As the temporary support 31, it is possible to use for example an inexpensive FR-4 board or a resin board not containing glass fiber.

Next, as shown in FIG. 5B, a semiconductor chip 25 is bonded to the bottom of the through hole 24 with its back surface 25B facing downward, the electrode terminals 25E formed on the upward facing active surface 25A and interconnection pattern 22 of the printed circuit board 23 are connected by bonding wires 26, then the resin sealing layer 27 is formed to integrally seal the semiconductor chip 25 and bonding wires 26 and fix the semiconductor chip 25 in the through hole 24. The sealing resin layer 27 is formed by potting etc. At that time, the dam bar 30 prevents the sealing resin from flowing outside of the necessary location.

Next, as shown in FIG. 5C, the temporary support 31 is removed by peeling it off or by grinding and polishing, then the bottom surface of the printed circuit board 23, the downward facing back surface of the semiconductor chip 25, and the bottom surface of the sealing resin layer 27 are ground and polished to make them thin and finish them to the same flat surface. If necessary, the finished surface obtained by the grinding and polishing can be covered by insulation by printing a resin material, spray coating, adhering a resin film, etc.

Next, solder balls 28 are formed as outside connection electrodes on the interconnection pattern 22 exposed at the openings 29 of the solder resist 29. The solder balls 28 may also be formed before the above grinding and polishing.

Finally, the printed circuit board 23 is cut between the areas for forming the individual semiconductor devices to separate the individual semiconductor devices 11.

Second Embodiment

An example of a preferred embodiment of a semiconductor device and its process of production according to third and fourth aspects of the present invention will be explained next with reference to FIG. 3B and FIGS. 6A–6E.

Figure 3B:
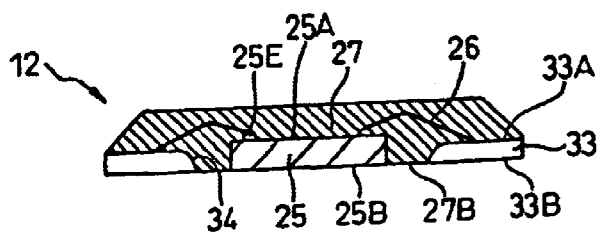

The semiconductor device 12 according to the third aspect of the invention shown in FIG. 3B is comprised of a lead frame 33 having a top surface 33A and a bottom surface 33B and a semiconductor chip 25 housed in a through hole 34 of the frame with its active surface 25A facing upward. The electrode terminals 25E of the active surface 25A are connected to the top surface 33A of the lead frame 33 by bonding wires 26. A sealing resin layer 27 seals the bonding wires 26 and the semiconductor chip 25 together and fixes the semiconductor chip 25 in the through hole 34. The bottom surface 33B of the lead frame 33, the downward facing back surface 25B of the semiconductor chip 25, and the bottom surface 27B of the sealing resin layer 27 are finished to the same flat surface by grinding and polishing.

The semiconductor device 12 is produced by the steps shown in FIGS. 6A–6E.

Figure 6A:
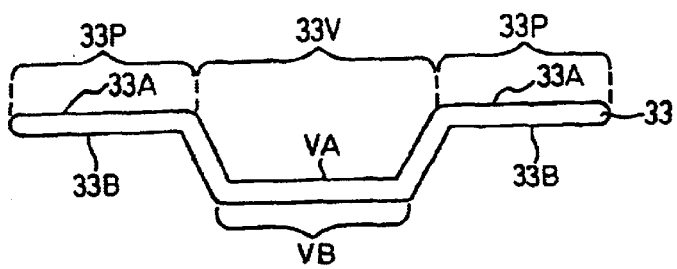
FIGS. 6A to 6E are sectional views of the structure by process steps of production of a semiconductor device according to the third aspect of the invention shown in FIG. 3B.

First, a lead frame 33 having a die pad such as a QFP shown in FIG. 6A is prepared. This is shaped by a press etc. to provide a planar part 33P and a die pad, that is, a vessel 33V. The bottom VB of the vessel 33V projects downward from the bottom surface 33B of the planar part 33P. The top end of the vessel 33V is connected to the top surface 33A of the planar part 33P. The lead frame 33 is a matrix lead frame having a large number of areas for forming semiconductor devices. The figure, however, shows only one area for forming a semiconductor device.

Figure 6B:
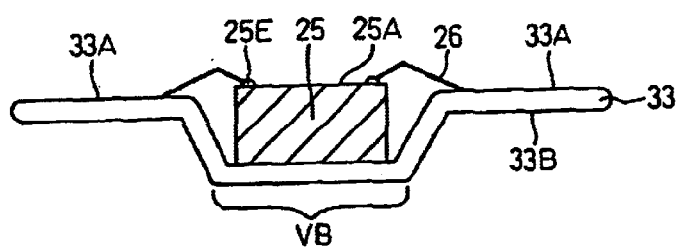

Next, as shown in FIG. 6B, a semiconductor chip 25 is bonded to the bottom surface VA of the vessel 33V with its active surface 25A facing upward and becoming higher than the bottom surface 33B of the planar part 33P, then the electrode terminals 25E formed on the active surface 25A of the semiconductor chip 25 are connected to the top surfaces 33A of the inner leads forming part of the planar part 33P of the lead frame 33 by bonding wires 26.

Figure 6C:
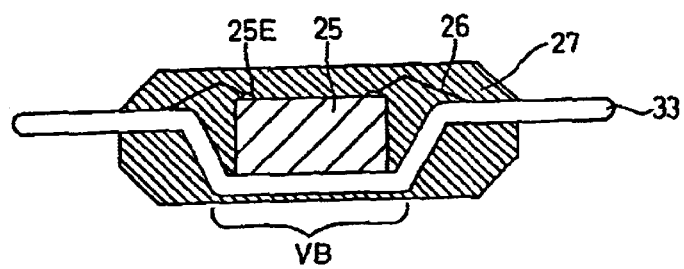
Figure 6D:
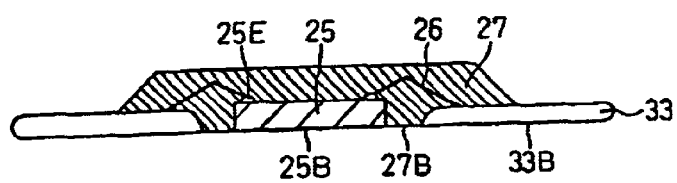

Next, as shown in FIG. 6C, transfer molding is used to seal the semiconductor chip 25 by a resin. The thus formed sealing resin layer 27 seals the bonding wires 26 and the semiconductor chip 25 integrally and fixes the semiconductor chip 25 in the vessel 33V.

Next, as shown in FIG. 60, the vessel 33V of the lead frame 33, the semiconductor chip 25, and the sealing resin layer 27 are ground and polished from the bottom to substantially remove the vessel layer 33V and finish the bottom surface 33B of the planar part 33P of the lead frame 33, the downward facing back surface 25B of the semiconductor chip, and the bottom surface 27B of the sealing resin layer to the same flat surface. If necessary, the finished surface obtained by the grinding and polishing can be covered by insulation by printing a resin material, spray coating, adhering a resin film, etc.

Figure 6E:
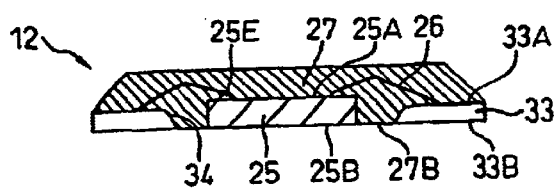

Finally, as shown in FIG. 6E, the lead frame 33 is cut between the areas for forming the individual semiconductor devices to separate the individual semiconductor devices 12. In this example, for reducing the size, it is cut along the outer edges of the sealing resin layer 27 as illustrated, but it is also possible to cut at a position further outward and to have the outer leads project out from the sealing resin layer 27.

Third Embodiment

An example of a preferred embodiment of a semiconductor device and its process of production according to fifth and sixth aspects of the present invention will be explained next with reference to FIG. 3C and FIGS. 7A–7D.

Figure 3C:
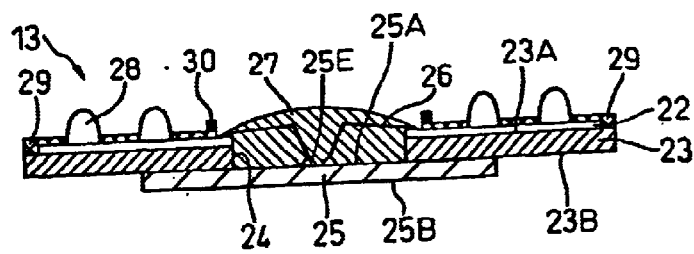

The semiconductor device 13 according to the fifth aspect of the invention shown in FIG. 3C is comprised of a printed circuit board 23 provided with a through hole 24 and an interconnection pattern 22 on its upper surface 23A and a semiconductor chip 25 bonded at its active surface 25A to the bottom surface 23B and defining a bottom of the through hole 24. The electrode terminals 25E of the active surface 25A defining the bottom are connected with the interconnection pattern 22 by bonding wires 26 passing through the through hole 24. A sealing resin layer 27 fills the through hole 24 and seals the bonding wires 26. The downward facing back surface 25B of the semiconductor chip 25 is finished by grinding and polishing.

Solder balls 28 are formed as outer connection terminals at predetermined locations of the interconnection pattern 22. The other portions of the interconnection pattern 22 are covered by a solder resist layer 29. The outer edges of the sealing resin layer 27 are defined by a dam bar 30 formed by a resin. In the semiconductor device of the present example, the sizes (planar area) of the semiconductor chip 25 and the printed circuit board 23 may be substantially the same.

The semiconductor device 13 is produced by the steps shown in FIGS. 7A–7D.

Figure 7A:
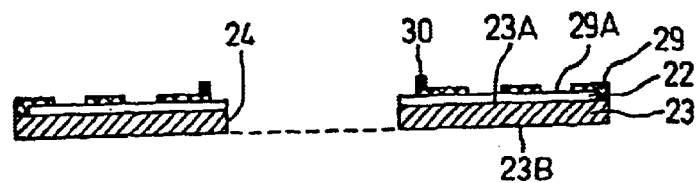
FIGS. 7A to 7D are sectional views of the structure by process steps of production of a semiconductor device according to the fifth aspect of the Invention shown in FIG. 3C.

First, as shown in FIG. 7A, a printed circuit board 23 provided with a through hole 24 and an interconnection pattern 22 on its top surface 23A is prepared. The printed circuit board 23 can take various forms. As one example, it is a glass epoxy substrate clad on its top surface with copper foil which is etched to form the interconnection pattern 22. The printed circuit board 23 used in this embodiment is a matrix printed circuit board including a large number of areas for forming semiconductor devices.

Figure 7B:
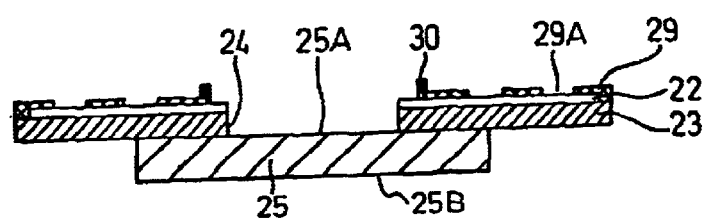
Figure 7C:
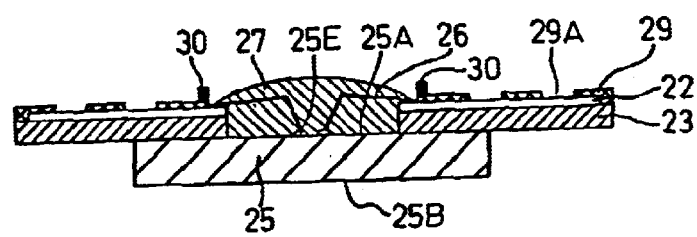
Figure 7D:
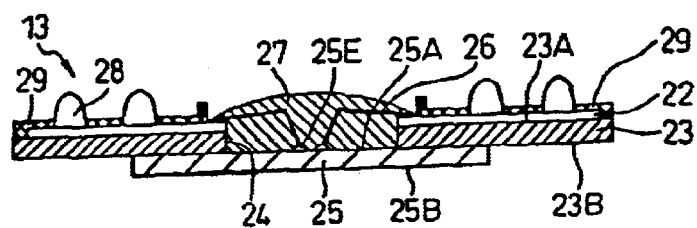

The top surface of the interconnection pattern 22 is covered by a solder resist layer 29 except at the openings 29A for forming the solder balls in a later step (FIG. 7D). Further, a frame-shaped dam bar 30 surrounding the upper edges of the through hole 24 is provided to define the outer edges of the sealing resin layer in a later step (FIG. 7C). The dam bar 30 is formed by coating a resin in a frame shape by a dispenser, then curing it.

Next, as shown in FIG. 7B, the active surface 25A of a semiconductor chip 25 is bonded by an adhesive etc. to the portion including the through hole 24 of the bottom surface 23B of the printed circuit board 23 so as to block the bottom end of the through hole 24 and define a bottom.

Next, as shown in FIG. 7C, the electrode terminals 25E formed by the upward facing active surface 25A of the semiconductor chip 25 defining the bottom of the through hole 24 and the interconnection pattern 22 of the printed circuit board 23 are connected by bonding wires 26, then a sealing resin layer 27 is formed to fill the through hole 24 and seal the bonding wires 26. The sealing resin layer 27 is formed by potting etc. At that time, the dam bar 30 prevents the outflow of the sealing resin from the required location.

Next, as shown in FIG. 7D, the downward facing back surface 25B of the semiconductor chip 25 is ground and polished to make it thin and finish it to a flat surface. If necessary, the finished surface obtained by the grinding and polishing can be covered by insulation by printing a resin material, spray coating, adhering a resin film, etc.

Next, solder balls 28 are formed as outer connection terminals on the interconnection pattern 22 exposed at the openings 29A of the solder resist layer 29. The solder balls 28 may also be formed before the above grinding and polishing.

Finally, the printed circuit board 23 is cut between the areas for forming the individual semiconductor devices to separate the individual semiconductor devices 23.

Note that the structure of FIG. 3C explained in the present example Is the structure with the printed circuit board 23 placed on the semiconductor chip 25, but by placing a lead frame 33 in the structure of FIG. 3B explained in the second embodiment on the semiconductor chip 25 instead of the printed circuit board 23, a reduction of thickness becomes possible even in a leadon-chip (LOC) structure known from Japanese Unexamined Patent Publication (Kokai) No. 4-44347.

Fourth Embodiment

An example of a preferred embodiment of a semiconductor device and its process of production according to seventh and eighth aspects of the present invention will be explained next with reference to FIG. 3D and FIGS. 8A–8C.

Figure 3D:
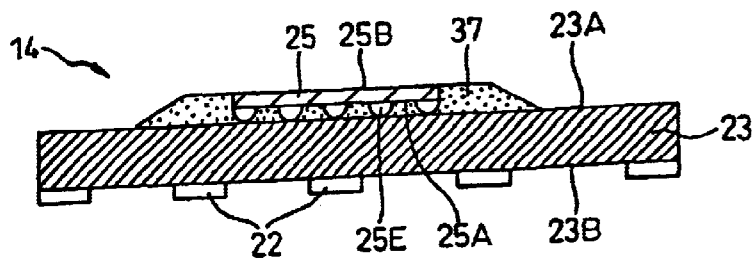

The semiconductor device 14 according to the seventh aspect of the invention shown in FIG. 3D is comprised of a printed circuit board 23 provided with an interconnection pattern on its bottom surface 23B and a semiconductor chip 25 connected by flip chip bonding to its top surface 23A with its active surface 25A facing downward. Note that it is also possible to form an interconnection pattern including connection terminals etc. on the top surface of the printed circuit board 23. An underfill material 37 is used to fill the area around the semiconductor chip 25 and the clearance between the active surface 25A of the semiconductor chip 25 and the top surface 23A of the printed circuit board 23. The upward facing back surface 25B of the semiconductor chip 25 is finished to a flat surface by grinding and polishing.

Figure 8A:
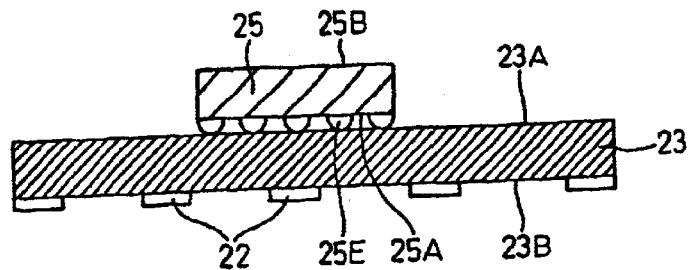
FIGS. 8A to 8C are sectional views of the structure by process steps of production of a semiconductor device according to the seventh aspect of the invention shown in FIG. 3C.
Figure 8B:
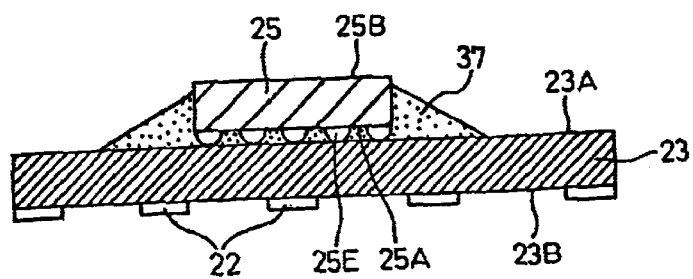
Figure 8C:
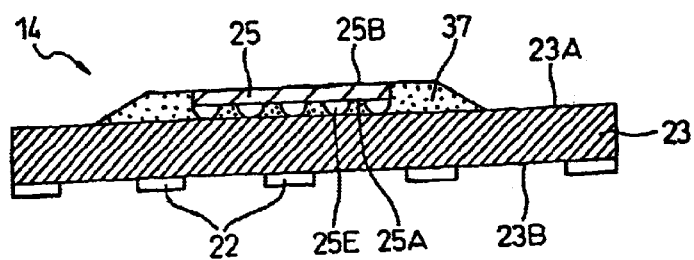

The semiconductor device 14 is produced by the steps shown in FIGS. 8A–8C.

First, as shown in FIG. 8A, a printed circuit board 23 provided with an interconnection pattern 22 on its bottom surface 23B is prepared. The printed circuit board 23 may take various forms. As one example, it is a glass epoxy substrate clad on its top surface with copper foil which is etched to form the interconnection pattern 22. The printed circuit board 23 used in this example is a matrix printed circuit board including a large number of areas for forming semiconductor devices.

The semiconductor chip 25 is connected by flip chip bonding with its active surface 25A facing down to the top surface 23A of the printed circuit board 23. Due to this, the electrode terminals 25E of the active surface 25A of the semiconductor chip 25 are bonded with the connection terminals (not shown) of the top surface 23A of the printed circuit board 23. The connection terminals are electrically connected with the interconnection pattern 22 of the bottom surface 23B through the conductors (not shown) in the printed circuit board 23.

Next, as shown in FIG. 8B, an epoxy resin or other underfill material 37 is used to fill the area around the semiconductor chip 25 and clearance between the active surface 25A of the semiconductor chip 25 and the top surface 23A of the printed circuit board 23.

Next, as shown in FIG. 8C, the upward facing back surface 25B of the semiconductor chip 25 is ground and polished to make the chip 25 thin and finish the back surface 25B to a flat surface. Typically, the top surface of the underfill material 37 is finished to the same flat surface as the back surface 25B of the semiconductor chip 25. If necessary, the finished surface obtained by the grinding and polishing can be covered by insulation by printing a resin material, spray coating, adhering a resin film, etc. Next, solder balls or other outer connection terminals (not shown) are formed on the interconnection pattern 22. The external connection terminals can also be formed before the grinding and polishing. Finally, the printed circuit board is cut between the areas for forming the individual semiconductor devices to separate the individual semiconductor devices 14.

Fifth Embodiment

An example of a preferred embodiment of a semiconductor device and its process of production according to the ninth to 11th aspects of the present invention will be explained next with reference to FIG. 4 and FIGS. 9A–9E.

Figure 4:
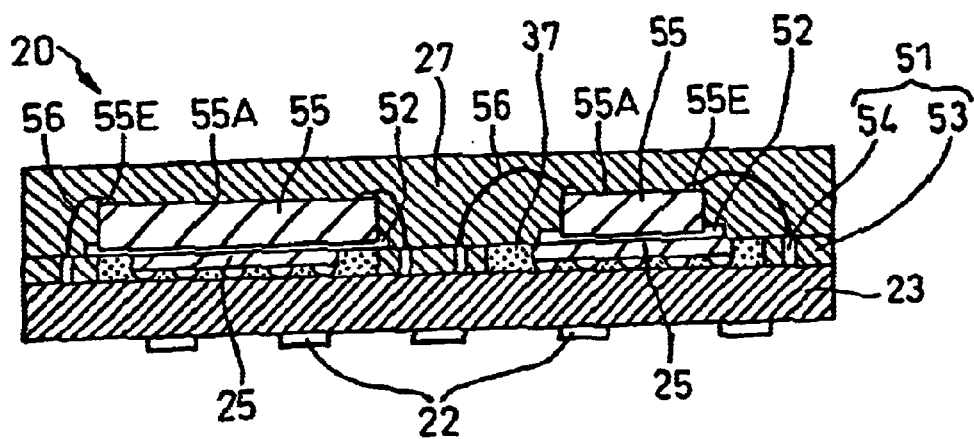
FIG. 4 is a sectional view of a stacked-chip type semiconductor device of the present invention having another semiconductor chip mounted above the semiconductor chip of the semiconductor device of the seventh aspect of the invention shown in FIG. 3D.

The semiconductor device 20 according to the ninth to 11th aspects of the invention shown in FIG. 4 is a stacked chip type semiconductor device comprised of a semiconductor chip 25 finished by grinding and polishing of the semiconductor device 14 of the fourth embodiment shown in FIG. 3D and another semiconductor chip 55 bonded on its back surface to the former's back surface. The semiconductor device 20 of FIG. 4, however, is provided with a via layer 51 for electrically connecting the top layer semiconductor chip 55 and the printed circuit board 23 between the individual semiconductor chips 25 shown in FIG. 3D. The via layer 51 is comprised of an insulating substrate 53 such as a resin similar to the printed circuit board 23 provided with vias 54 passing through it.

The electrode terminals 55E formed on the upward facing active surface 55A of the top layer semiconductor chip 55 are connected with the top ends of the vias 54 by bonding wires 56. The bottom ends of the vias 54 are connected to connection terminals (not shown) provided correspondingly on the top surface of the printed circuit board 23. Further, they are connected with the interconnection pattern 22 at the bottom surface of the printed circuit board 23 (or the semiconductor chip 25 of the further lower layer) through the interconnection layer (not shown) inside the printed circuit board 23. The back surfaces of the bottom layer semiconductor chip 25 and the top layer semiconductor chip 55 are bonded, as explained with respect to the manufacturing process mentioned later, by coating a resin 52 in the semicured state to the back surface of the bottom layer chip 25, placing the top layer chip 55 on the resin layer 52, then curing the resin layer 52. The clearance between the bottom layer chip 25 and the via layer 51 and the clearance between it and the top surface 23A of the printed circuit board 23 are filled by an underfill material 37. The top layer chip 55 may be made larger (FIG. 4 left side) or smaller (FIG. 4 right side) than the bottom layer chip 25. Further, it is possible to mount a plurality of chips 55 on one chip 25. A sealing resin layer 27 seals the bonding wires 56 and the semiconductor chips 55 integrally.

The semiconductor device 20 is produced by the steps shown in FIGS. 9A–9E.

First, as shown in FIG. 9A, a printed circuit board 23 provided with an interconnection pattern 22 on its bottom surface 23B is prepared as a matrix printed circuit board in the same way as the fourth embodiment. However, a via layer 51 is provided on the top surface 23A of the printed circuit board 23. The via layer 51 is formed with vias 54 by a conductive material passing through it. The insulating substrate 53 is formed with a window 58 for housing a bottom layer chip 25. The via layer 51 is provided over the entire surface of the printed circuit board 23. A large number of chips can be handled. As another form of the via layer 51, as shown in FIG. 9E, a resin or another insulating block 53 similar to the substrate of the printed circuit board 23 is formed with vias 54 of a conductive material passing through It. The connection terminals 57 with the printed circuit board 23 may be made connection parts formed by solder balls etc. These may be mounted on the printed circuit board 23 at the time of flip chip bonding of the semiconductor chip 25. Due to this, it is possible to simplify the structure of the board over the case of making the printed circuit board 23 and the via layer 51 integrally. This form also can handle a large number of chips.

The semiconductor chip 25 is connected by flip chip bonding with its active surface 25A facing down to the top surface 23A of the printed circuit board 23 exposed through the window 58 of the via layer 51. Due to this, the electrode terminals 25E of the active surface 25A of the semiconductor chip 25 are bonded with the connection terminals (not shown) of the top surface 23A of the printed circuit board 23. The connection terminals are electrically connected with the interconnection pattern 22 of the bottom surface 23B through the conductors (not shown) in the printed circuit board 23.

Next, as shown in FIG. 9B, an epoxy resin or other underfill material 37 is used to fill the area around the semiconductor chip 25 and the clearance between the active surface 25A of the semiconductor chip 25 and the top surface 23A of the printed circuit board 23.

Next, as shown in FIG. 9C, the upward facing back surface 25B of the semiconductor chip 25, the top surface of the underfill material 37, and the top surface of the via layer 51 are ground and polished to make the entire assembly including the chip 25 thin and to finish the back surface 258 of the semiconductor chip 25, the top surface of the underfill material 37, and the top surface of the via layer 51 to the same flat surface overall. If necessary, the finished surface obtained by the grinding and polishing can be covered by insulation by printing a resin material, spray coating, adhering a resin film, etc. to the same plane.

Next, as shown in FIG. 9D, a resin in a semicured state Is coated on the back surface 25B of the semiconductor device 25 (or further on the top surface of the underfill material 37 surrounding the semiconductor chip 25), another semiconductor chip 55 is placed on the resin coating layer 52 with its back surface facing downward, and the resin coating layer 52 is cured to bond the top layer semiconductor chip 55 to the bottom layer semiconductor chip 25. Next, wire bonding is used to connect the electrode terminals 55E formed on the upward facing active surface 55A of the top layer chip 55 and the top ends of the vias 54.

Next, the top layer semiconductor chip 55 is sealed by transfer molding or any other method. Next, solder balls or other outer connection terminals (not shown) are formed on the interconnection pattern 22.

Finally, the printed circuit board is cut between the areas for forming the individual semiconductor devices to separate the individual semiconductor devices 20.

In this embodiment, the explanation was given of a stacked chip type semiconductor device using the semiconductor device of the fourth embodiment of the seventh aspect of the invention, but the Invention is not limited to this. It is also possible to produce a stacked chip type semiconductor device in the same way for semiconductor devices of the first to third embodiments of the first, third, and fifth aspects of the invention.

Summarizing the effects of the invention, according to the present invention, the mounting height is reduced and simultaneously made even, there is no need for the complicated process of mounting individual chips, the manufacturing yield is improved, the heights of the semiconductor devices can be made uniform without being affected by variations in thickness of the chips, and electrical testing becomes possible in a block. In particular, employing the structure of the present invention is extremely advantageous in practice in the point of enabling inexpensive production of a thin-type semiconductor device using existing semiconductor assembly facilities and processes. Further, using the thin-type semiconductor device of the present invention enables a reduction of size and thickness of the electrical equipment including the semiconductor device.

While the invention has been described with reference to specific embodiment chosen for purpose of illustration, it should be apparent that numerous modifications could be made thereto by those skilled in the art without departing from the basic concept and scope of the invention.

What is claimed is:

1. A semiconductor device, comprising:
    a lead frame having leads and a through hole there through from its top surface to bottom surface;
    a semiconductor chip with its active surface facing upward and being housed within said through hole of said lead frame;
    wherein the electrode terminals on said semiconductor chip active surface are connected with the top surface of said lead frame by bonding wires; and
    a sealing resin layer which seals the bonding wires and semiconductor chip integrally, and which fixes the semiconductor chip within said through hole sealing thereabout;
        wherein the bottom surface of said lead frame, the downward facing back surface of said semiconductor chip, and the bottom surface of said sealing resin layer are all ground and polished to the same flat surface; and
    a second semiconductor chip bonded at its back surface to said first semiconductor chip back surface thereby having its active surface facing in the opposite direction of said first semiconductor chip active surface.

2. A semiconductor device, comprising:
    a printed circuit board having an interconnection pattern on its top surface, and a through hole there through from said top surface to the bottom surface thereof;
    a semiconductor chip housed inside said through hole of a printed circuit board with said semiconductor chip active surface facing upward;
    bonding wires connecting electrode terminals on said active surface with said interconnection pattern;
    a sealing resin layer sealing the bonding wires and said semiconductor chip integrally, and fixes the semiconductor chip inside said through hole sealing thereabout, and wherein the bottom surface of said printed circuit board, the downward facing back surface of said semiconductor chip, and the bottom surface of said sealing resin layer sealing about said semiconductor chip are all ground and polished to the same flat surface;

a second semiconductor chip bonded at its back surface to said first semiconductor chip back surface thereby having its active surface facing in the opposite direction of said first semiconductor chip active surface.

3. The semiconductor device of one of claims 1 and 2, also including:

a via layer for electrically connecting the first semiconductor chip and said printed circuit board, wherein said via layer is between said sealing resin layer and said printed circuit board.

4. The semiconductor device of claim 3, wherein said via layer includes an insulating substrate and electrical vias passing there through, and wherein the active surface of said second semiconductor chip is connected to the top ends of said electrical vias is by bonding wires.

5. The semiconductor device of claim 4, wherein said first and second semiconductor chips are bonded together, and also including an underfill material filling the clearance between the bottom of the first semiconductor chip and the via layer, and also filling the clearance between the bottom of the first semiconductor chip and the top surface of the printed circuit board.

6. A semiconductor device, comprising:

a printed circuit board provided with a through hole and an interconnection pattern on its top surface;

a first semiconductor chip having its active surface bonded to said printed circuit board bottom surface, the active surface of said first semiconductor chip closing off to define the closed bottom of said through hole;

second semiconductor chip bonded at its back surface to said first semiconductor chip back surface thereby having its active surface facing in the opposite direction of said first semiconductor chip active surface;

electrode terminals on said first semiconductor chip active surface connected with said interconnection pattern of said printed circuit board by bonding wires passing through said through hole; and a sealing resin layer filling said through hole and sealing said bonding wires;

wherein the downward facing back surface of said first semiconductor chip has a ground and polished finished surface.

7. A semiconductor device, comprising:

printed circuit board having an interconnection pattern on its bottom surface and a flip chip bonding pads on its top surface;

a first semiconductor chip with its active surface facing downward and being connected by flip chip bonding to said top surface of a printed circuit board whereof said tot surface pads are connected to said interconnection pattern on said printed circuit board bottom surface;

a second semiconductor chip bonded at its back surface to said first semiconductor chip back surface thereby having its active surface facing in the opposite direction of said first semiconductor chip active surface; and an underfill material filling an area around the entire side faces of said first semiconductor chip and filling the clearance between the active surface of said first semiconductor chip and the top surface of said printed circuit board;

wherein the upward facing back surface of said first semiconductor chip and the top surface of said underfill material are finished to a ground continuous flat surface.

* * * * *